United States Patent
Su et al.

(10) Patent No.: US 10,082,734 B2
(45) Date of Patent: Sep. 25, 2018

(54) COMPOSITION AND METHOD FOR LITHOGRAPHY PATTERNING

(71) Applicant: Taiwan Semiconductor Manufacturing Company, Ltd., Hsin-Chu (TW)

(72) Inventors: Yu-Chung Su, Hsinchu (TW); Ching-Yu Chang, Yilang County (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/621,512

(22) Filed: Feb. 13, 2015

(65) Prior Publication Data
US 2016/0238933 A1    Aug. 18, 2016

(51) Int. Cl.
| | |
|---|---|
| G03F 7/09 | (2006.01) |
| G03F 7/32 | (2006.01) |
| G03F 7/36 | (2006.01) |
| G03F 7/039 | (2006.01) |
| G03F 7/038 | (2006.01) |
| H01L 21/308 | (2006.01) |
| H01L 21/027 | (2006.01) |
| C09D 5/00 | (2006.01) |

(52) U.S. Cl.
CPC ............ *G03F 7/091* (2013.01); *C09D 5/006* (2013.01); *G03F 7/038* (2013.01); *G03F 7/0382* (2013.01); *G03F 7/0392* (2013.01); *G03F 7/322* (2013.01); *G03F 7/325* (2013.01); *G03F 7/36* (2013.01); *H01L 21/0276* (2013.01); *H01L 21/3081* (2013.01)

(58) Field of Classification Search
None
See application file for complete search history.

(56) References Cited

U.S. PATENT DOCUMENTS

| | | |
|---|---|---|
| 5,886,102 A | 3/1999 | Sinta et al. |
| 6,852,473 B2 | 2/2005 | Roberts et al. |
| RE41,128 E | 2/2010 | Deshpande |
| 8,216,767 B2 | 7/2012 | Wang et al. |
| 8,323,870 B2 | 12/2012 | Lee et al. |

(Continued)

OTHER PUBLICATIONS

Aldrich N.K. Lau et al., "New Thermal Cross-Linkers Based on Triazene: Cross-Linking of Fluorinated Polyimides and Aromatic Polymers," 1992 American Chemical Society, Macromolecules, 1992, 25 (26), pp. 7294-7299.

*Primary Examiner* — Sin J Lee
(74) *Attorney, Agent, or Firm* — Haynes and Boone, LLP

(57) ABSTRACT

An anti-reflective coating (ARC) composition for use in lithography patterning and a method of using the same is disclosed. In an embodiment, the ARC composition comprises a polymer having a chromophore; an acid labile group (ALG), more than 5% by weight; a thermal acid generator; and an optional crosslinker. The method includes applying the ARC composition over a substrate; crosslinking the polymer to form an ARC layer; cleaving the ALG of the ARC layer to reduce a film density of the ARC layer; forming a resist layer over the ARC layer, patterning the resist layer, and etching the ARC layer. Due to reduced film density, the ARC layer has a high etching rate, thereby preserving the critical dimension (CD) of the resist pattern during the etching process.

20 Claims, 4 Drawing Sheets

(56) References Cited

U.S. PATENT DOCUMENTS

| | | |
|---|---|---|
| 8,481,247 B2 | 7/2013 | Horiguchi et al. |
| 8,580,117 B2 | 11/2013 | Kao et al. |
| 8,658,344 B2 | 2/2014 | Wang et al. |
| 8,715,919 B2 | 5/2014 | Chang et al. |
| 8,741,551 B2 | 6/2014 | Wu et al. |
| 2005/0214674 A1* | 9/2005 | Sui ................. G03F 7/0392 430/270.1 |
| 2007/0207406 A1 | 9/2007 | Guerrero et al. |
| 2007/0238052 A1* | 10/2007 | Zampini ............. G03F 7/091 430/311 |
| 2010/0040971 A1 | 2/2010 | Tarutani et al. |
| 2011/0121356 A1* | 5/2011 | Krawinkel ............ C03C 27/10 257/100 |
| 2013/0323641 A1 | 12/2013 | Chang |
| 2014/0011133 A1 | 1/2014 | Liu et al. |
| 2014/0017615 A1 | 1/2014 | Chang |
| 2014/0017616 A1 | 1/2014 | Chang |
| 2014/0065843 A1 | 3/2014 | Chang et al. |
| 2014/0117563 A1 | 5/2014 | Yu et al. |
| 2014/0120459 A1 | 5/2014 | Liu et al. |
| 2014/0186773 A1 | 7/2014 | Chang |
| 2014/0255850 A1 | 9/2014 | Chang et al. |
| 2014/0272709 A1 | 9/2014 | Liu et al. |
| 2014/0272726 A1 | 9/2014 | Chang |
| 2014/0273521 A1 | 9/2014 | Wu et al. |
| 2015/0261024 A1* | 9/2015 | Chung ................ G02F 1/1309 324/762.09 |

\* cited by examiner

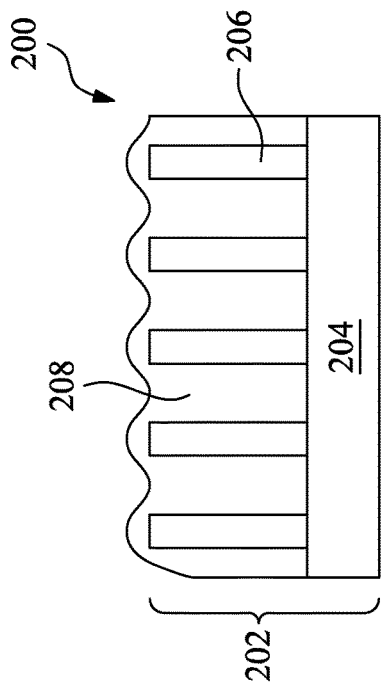
FIG. 2A
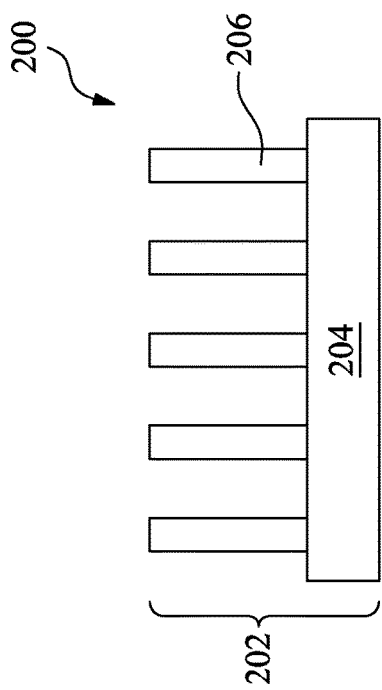
FIG. 2C
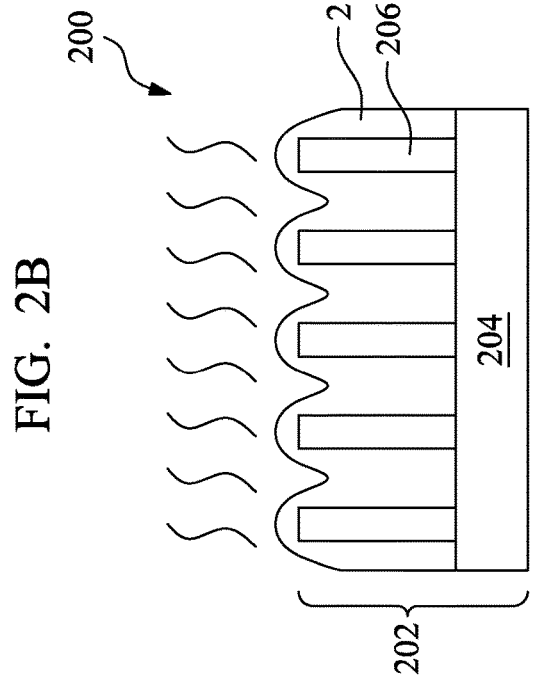
FIG. 2B
FIG. 2D

COMPOSITION AND METHOD FOR LITHOGRAPHY PATTERNING

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, reflectivity control has been a challenge for lithography. In a typical lithography process, a resist film is coated on a surface of a wafer and is subsequently exposed and developed to form a resist pattern. The resist pattern is then used for etching the wafer to form an IC. When the resist film is exposed with a radiation, it is important that reflection of the radiation by any resist under-layers be controlled. Otherwise, the reflection might negatively affect the resist pattern resolution. Reflection control is particularly troublesome when the wafer has high aspect ratio topography, such as complicated FinFET structures or other three-dimensional microstructures. One approach is to apply an anti-reflective coating (ARC) layer underneath the resist layer and use the ARC layer to absorb the radiation during exposure. The ARC layer is subsequently etched using the resist pattern as an etch mask, thereby exposing the wafer underneath for further processes. However, a typical ARC layer has low etching rate (high etching resistance). When the ARC layer is etched, the resist pattern is also considerably consumed, leading to undesirable resist pattern CD shrinkage and associated fabrication issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-2I illustrate cross sectional views of forming a semiconductor device according to the method of FIG. 1, in accordance with an embodiment.

DETAILED DESCRIPTION

Figure 1:
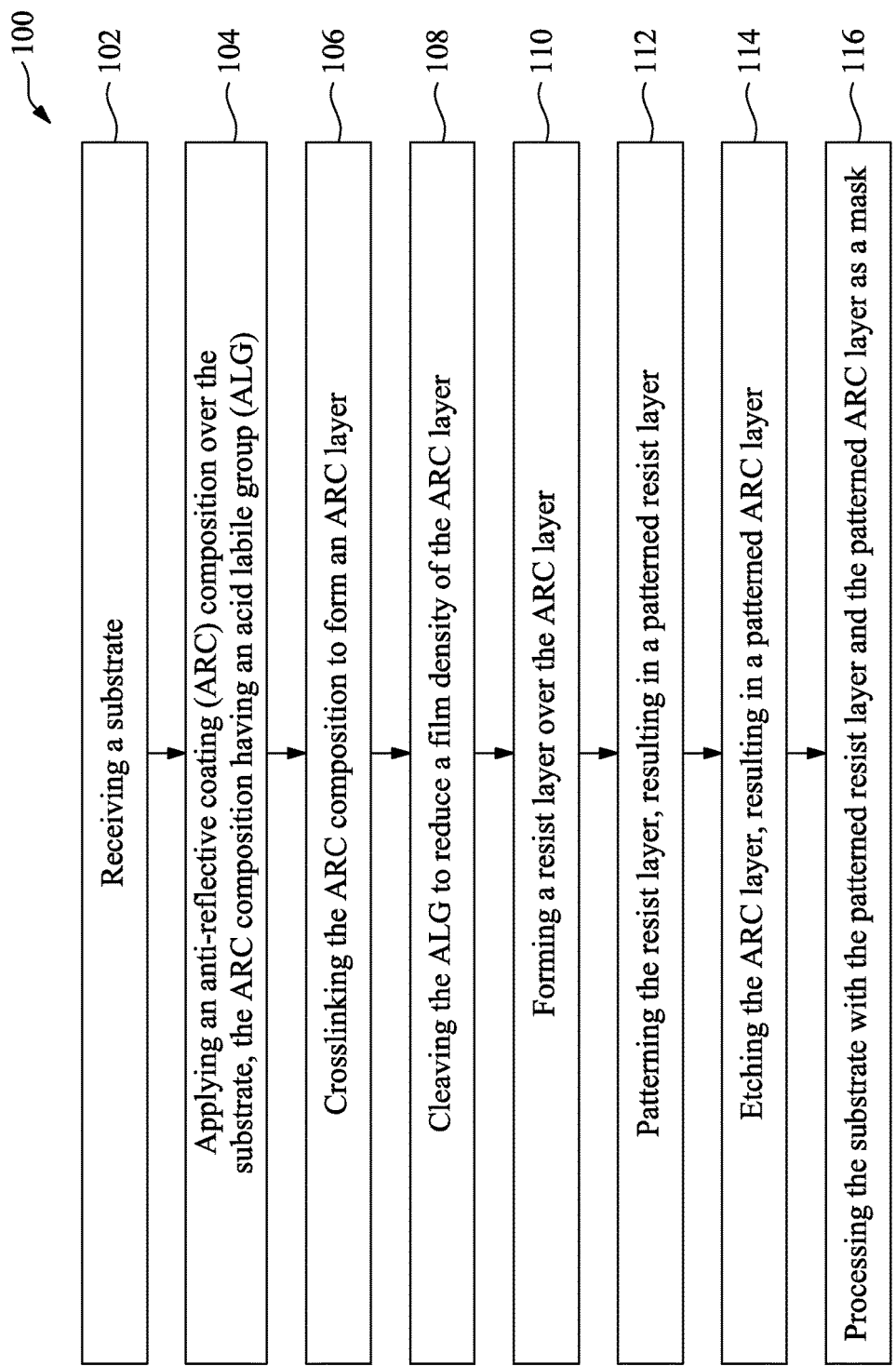
FIG. 1 illustrates a flow chart of a lithography patterning method according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to compositions and methods for semiconductor device fabrication, and more particularly to anti-reflective coating (ARC) compositions and methods of using the same in lithography patterning. According to various aspects of the present disclosure, the ARC compositions provide advantages over existing ones because an ARC layer formed thereof has relatively lower film density and relatively higher etching rate. Therefore, when the ARC layer is etched to expose layers underneath, an over-layer resist pattern is substantially preserved and lithography pattern fidelity is thereby improved.

In various embodiments, the ARC composition includes a polymer that includes a polymer backbone, a crosslinkable group, and a chromophore. The ARC composition further includes an acid labile group (ALG) and a thermal acid generator associated with the ALG. In embodiments, the ALG is attached to or is part of the polymer backbone. In some cases, the ALG connects some of the chromophore to the polymer backbone. In embodiments, the polymer comprises about 35% to about 95% by weight of the ARC composition and the ALG comprises more than 5% by weight of the ARC composition. In embodiments, the thermal acid generator comprises about over 0.05% by weight of the ARC composition. In an embodiment, the ARC composition further includes a crosslinker for linking the polymer in a curing process. To further this embodiment, the crosslinker comprises less than about 60% by weight of the ARC composition. In embodiments where the ARC composition includes a crosslinker, the ALG may be attached to the crosslinker instead of or in addition to the polymer backbone. In alternative embodiments, the polymer can form crosslinks by itself, in which case a crosslinker is not required.

According to various aspects of the present disclosure, the ARC composition may be dissolved in a solvent and the mixture is applied onto a surface of a substrate by a process such as spin coating. The ARC composition is then cured using a process, such as radiation by an ultraviolet (UV) light or baking at certain temperature. The curing process causes crosslinking reaction among the polymer, either through the polymer's own crosslinking functional groups or through the optional independent crosslinker. The crosslinking reaction results in a dense ARC film. The curing process may also drive out the solvent, further solidifying the dense ARC film. The dense ARC film typically exhibits high etching resistance due to the polymer backbone and the presence of the chromophore, among other factors.

According to the present disclosure, the dense ARC film is further processed before being used as a resist under-layer. The further process aims to reduce the ARC film's density thereby reducing its etching resistance. In an embodiment, the dense ARC film undergoes a baking process at a temperature that is sufficiently high to cause the thermal acid generator in the ARC film to generate an acid. The acid cleaves the ALGs from the polymer backbone or from the optional crosslinker. The cleaved components evaporate in the same baking process. The cleaving and evaporation effectively reduces the density of the ARC film and lowers its etching resistance. This greatly alleviates the resist CD shrinkage issue discussed above when the ARC film is etched in a later step.

The following discussion is directed to more detailed descriptions of some components of the ARC composition and some exemplary processes of making the same.

In various embodiments of the present disclosure, the ALG is an adamantyl group, a noradamantyl group, a decalin residue, or other acid labile (or acid decomposable) functional group. In some embodiments, the ALG is represented by one of the following formulae:

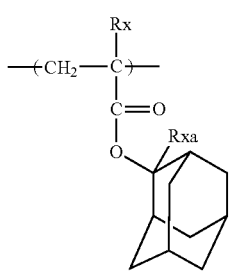
(1)

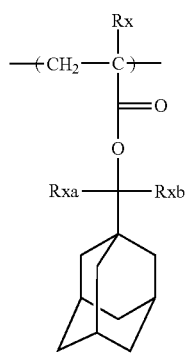
(2)

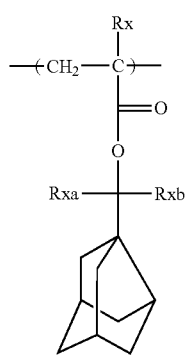
(3)

In the above formulae, Rx represents H, $CH_3$, $CH_2OH$, and each of Rxa and Rxb independently represents an alkyl group having a carbon number of 1 to 4. More examples of ALGs that can be used in the ARC composition of the present disclosure can be found in U.S. Patent Application Publication No. 2010/0040971, incorporated herein by reference for its teaching of acid-decomposable functional groups.

In various embodiments of the present disclosure, the polymer is suitable for use in deep UV (DUV) imaging systems. The polymer includes a chromophore for effectively absorbing reflections in the DUV range, such as from about 100 nm to about 300 nm. In an embodiment, the chromophore is an aromatic group such as a polycyclic hydrocarbon or heterocyclic unit and may include substituted and unsubstituted phenanthryl, substituted and unsubstituted anthracyl, substituted and unsubstituted acridine, substituted and unsubstituted naphthyl, substituted and unsubstituted quinolinyl, ring-substituted quinolinyls, and substituted and unsubstituted anthracyl groups. More examples of chromophore that can be used in the ARC composition of the present disclosure can be found in U.S. Pat. No. 5,886,102, incorporated herein by reference in its entirety. In various embodiments, the polymer including the chromophore is suitable for use in another imaging system, such as a system using UV radiation, extreme UV (EUV) radiation, electron beam, ion beam, x-ray, or other suitable radiation.

In some embodiments of the present disclosure, the polymer comprises recurring monomers represented by the following formula:

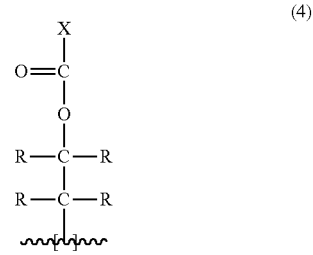
(4)

polymer backbone wherein R is individually selected from the group consisting of —OH, —H, and substituted and unsubstituted alkyl groups. In an embodiment, X includes one of the chromophore discussed above. In another embodiment, X includes an aromatic and/or heterocyclic light-absorbing moiety such as those selected from the group consisting of thiophenes, naphthoic acid, anthracene, naphthalene, benzene, chalcone, phthalimides, pamoic acid, acridine, azo compounds, dibenzofuran, and derivatives thereof. In yet another embodiment, X includes an ALG, such as the ALGs discussed above. In yet another embodiment, X includes a crosslinker. In some embodiments of the present disclosure, the polymer of the ARC composition is represented by the following formula:

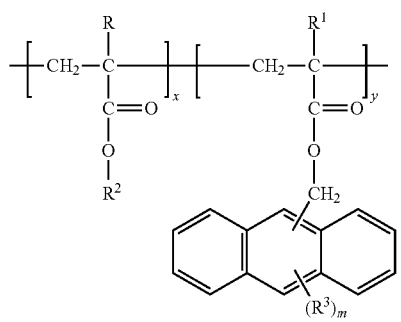

(5)

wherein R and R¹ is independently a hydrogen or a substituted or unsubstituted alkyl group, R² is a substituted or unsubstituted alkyl group, R³ is a halogen, an alkyl, an alkoxy, an alkenyl, an alkynyl, or a combination thereof. More examples of polymer that can be used for the ARC composition of the present disclosure can be found in U.S. Reissue Pat. RE41,128 and U.S. Pat. No. 5,886,102, both of which are incorporated herein by reference in their entirety.

In various embodiments of the present disclosure, the crosslinker may be part of the polymer functional groups or may be an independent crosslinker. In an embodiment, the crosslinker is a polyether polyol, a polyglycidyl ether, or a combination thereof. In an example, the polyether polyol is a compound represented by the following formula:

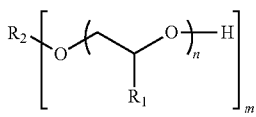

(6)

wherein R1 represents a hydrogen atom or an alkyl group; and R2 represents an alkyl group, an alkenyl group, an alkynyl group, an alkylcarbonyl group, an alkyloxyalkyl group, an alkylamino group, an alkyldiamino group, or a combination thereof. In an example, the polyglycidyl ether is a compound represented by the following formula:

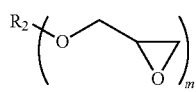

(7)

wherein the R2 may be an alkyl group with hydrogen attached of hydrocarbon with straight, branched, or cyclic structure. The alkyl group may also contain hetero atoms. For example, it may contain nitrogen or oxygen. The glycidyl ether can be replaced by alkyl oxide, alkene, alkyne, triazene or other crosslinkable functional groups such as those represented by one of the following formulae:

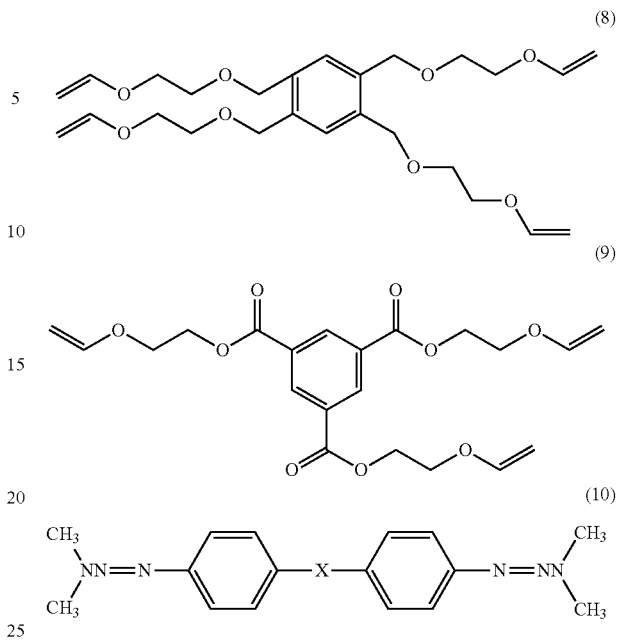

In another example, the crosslinker is a methoxy methylated glycouril represented by the following formula:

More examples of crosslinkers that can be used for the ARC composition of the present disclosure can be found in U.S. Reissue Pat. RE41,128, U.S. Pat. No. 5,886,102, and U.S. Patent Publication No. 2007/0207406, all of which are incorporated herein by reference in their entirety.

In various embodiments, the ARC composition may include other optional ingredients, such as surfactants and adhesion promoters.

In various embodiments, the ARC composition can be synthesized by an ordinary method, such as radical polymerization. For example, a batch polymerization method can be used. To further this example, various monomer species and a radical initiator are dissolved in a solvent for a sufficient amount of time, either heated or in ambient temperature, to form a substantially homogeneous dispersion. Alternative method can be used. For example, a dropping polymerization method can be used in forming the ARC composition where a solution containing various monomer species and a radical initiator is added dropwise to a heated solvent. In various embodiments, the solvent is selected from the group consisting of propylene glycol methyl ether acetate (PGMEA), propylene glycol methyl ether (PGME), propylene glycol n-propyl ether (PnP), ethyl lactate (EL), and mixtures thereof.

The following discussion is directed to methods of using embodiments of the ARC composition in lithography patterning.

FIG. 1 is a flow chart of a method 100 of patterning a substrate (e.g., a semiconductor wafer) according to various aspects of the present disclosure. Additional operations can be provided before, during, and after the method 100, and some operations described can be replaced, eliminated, or moved around for additional embodiments of the method. The method 100 is an example, and is not intended to limit the present disclosure beyond what is explicitly recited in the claims. The method 100 is described below in conjunction with FIGS. 2A-2I wherein a semiconductor device 200 is fabricated by using embodiments of the method 100. The semiconductor device 200 may be an intermediate device fabricated during processing of an IC, or a portion thereof, that may comprise SRAM and/or other logic circuits, passive components such as resistors, capacitors, and inductors, and active components such as p-type FETs (PFETs), n-type FETs (NFETs), fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

The method 100 (FIG. 1) receives a substrate 202 (FIG. 2A) at operation 102 and the substrate 202 is to be processed using lithography patterning methods. Referring to FIG. 2A, the substrate 202 includes one or more layers of material or composition. In an embodiment, the substrate 202 is a semiconductor substrate (e.g., wafer). In another embodiment, the substrate 202 includes silicon in a crystalline structure. In alternative embodiments, the substrate 202 includes other elementary semiconductors such as germanium, or a compound semiconductor such as silicon carbide, gallium arsenide, indium arsenide, and indium phosphide. The substrate 202 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers. In the present embodiment, the substrate 202 includes a first layer 204 and a second layer 206. In various embodiments, the second layer 206 may include a high-k dielectric layer, a gate layer, a hard mask layer, an interfacial layer, a capping layer, a diffusion/barrier layer, a dielectric layer, a conductive layer, other suitable layers, and/or combinations thereof. In one example, the second layer 206 includes fin-like structures for forming FinFETs. The various structures in the second layer 206 have high aspect ratio. Such topography presents a challenge for radiation reflection control during a typical lithography process.

The method 100 (FIG. 1) proceeds to operations 104 by applying an anti-reflective coating (ARC) composition 208 (FIG. 2B) over the substrate 202. Referring to FIG. 2B, the ARC composition 208 is constructed according to various aspects of the present disclosure. Specifically, the ARC composition 208 includes a polymer, an acid labile group (ALG), a thermal acid generator associated with the ALG, and an optional crosslinker. The polymer includes a polymer backbone, a crosslinkable group, and a chromophore for absorbing a radiation in the upcoming lithography patterning process. The ARC composition 208 is dissolved in a solvent. In an embodiment, the dissolved ARC composition 208 is applied onto the substrate 202 by a spin coating process.

The method 100 (FIG. 1) proceeds to operation 106 by crosslinking (or curing) the ARC composition 208 to form an ARC layer 210 (FIG. 2C). Referring to FIG. 2C, the crosslinking reaction causes the polymers to connect with each other through either the crosslinkable groups of the polymers and/or through the optional crosslinker. Operation 106 may further drive out the solvent. As a result, the ARC composition 208 solidifies and becomes the dense ARC layer 210. In an embodiment, the crosslinking reaction can be effectuated by radiating the ARC composition 208 with an ultraviolet (UV) radiation, such as from about 10 nm to about 400 nm. This may be performed at room temperature. In an embodiment, the ARC composition 208 includes an epoxy crosslinker and the crosslinking reaction can be effectuated at a low temperature in the absence of an acid. In another embodiment, the ARC composition 208 includes two thermal acid generators, one responsible for generating a first acid for crosslinking reaction at a first temperature and another responsible for generating a second acid for cleaving the ALG at a second temperature that is higher than the first temperature, wherein the first acid is different from the second acid. To further this embodiment, operation 106 includes baking the ARC composition 208 at a temperature that is sufficient to trigger the generation of the first acid but not enough to trigger the generation of the second acid. In various embodiments, operation 106 is performed at a temperature that is lower than what is needed to cleave the ALG. In one example, the thermal acid generator associated with the ALG is triggered at or above 180 degrees Celsius and operation 106 is performed at or below 150 degrees Celsius.

The method 100 (FIG. 1) proceeds to operation 108 by cleaving the ALG in the ARC layer 210 so as to reduce the ARC layer's film density. The ARC layer with reduced density is hereinafter referred to as an ARC layer 212 (FIG. 2D). Referring to FIG. 2D, in an embodiment, the cleaving of the ALG is effectuated by baking the ARC layer 210 at a temperature high enough to thermally generate an acid in the ARC layer. In one example, the ARC layer 210 is baked at or above 180 degrees Celsius. The acid cleaves the ALG off of the polymer backbone and/or the optional crosslinker. The cleaved-off components evaporate during the baking process. As a result, the ARC layer 212 has less polymer segment per unit area, hence less film density, than the ARC layer 210. In some cases where the ALG connects some of the chromophore to the polymer backbone, the cleaving process removes both the ALG and the associated chromophore, further reducing the film density. The embodiment of the ARC composition 208 is tuned to have proper ratio among ALG, chromophore, and/or crosslinker so that even after some of the chromophore is removed during the cleaving process, the ARC layer 212 still has sufficient amount of chromophore for absorbing radiation during a further exposure step. After operation 108, the ARC layer 212 achieves a lower etching resistance than the ARC layer 210 does and is ready to be used as a resist under-layer.

Figure 2E:
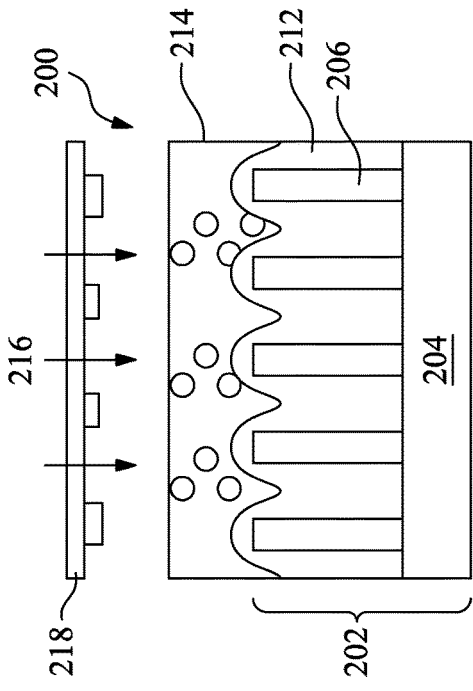

The method 100 (FIG. 1) proceeds to operations 110 by forming a resist layer 214 over the ARC layer 212. Referring to FIG. 2E, in an embodiment, the resist layer 214 is formed by spin coating a resist material, followed by a soft baking process and a hard baking process. In an embodiment, the resist layer 214 is a DUV resist such as a krypton fluoride (KrF) resist or an argon fluoride (ArF) resist. In another embodiment, the resist layer 214 is an I-line resist, a EUV resist, an electron beam (e-beam) resist, or an ion beam resist. In the present embodiment, the resist layer 214 is a positive resist. A positive resist is typically insoluble in a developer but becomes soluble upon radiation. One exemplary positive resist is a chemically amplified resist (CAR) that contains backbone polymer protected by ALGs and further contains photo-acid generators (PAGs). The PAGs can produce an acid upon radiation and the acid can catalyze the cleaving of the ALGs from the backbone polymer, increasing the polymer's solubility to a positive tone developer. In an alternative embodiment, the resist layer 214 is a negative resist. A negative resist is typically soluble in a developer but becomes insoluble upon radiation.

The method 100 (FIG. 1) proceeds to operation 112 by patterning the resist layer 214. This includes multiple steps, such as exposing, post-exposure baking, and developing.

Figure 2F:
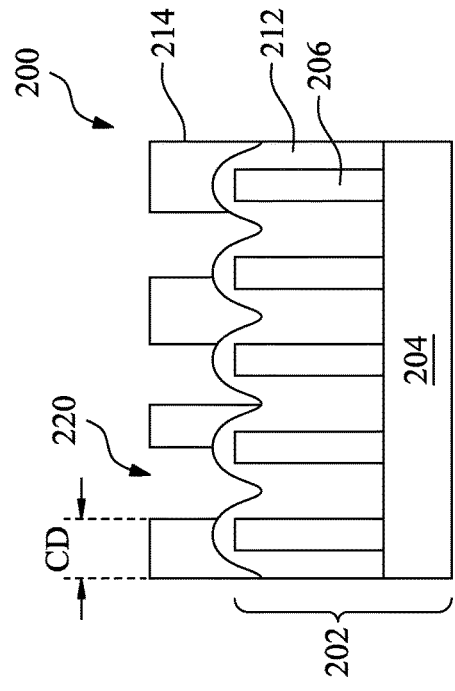

Referring to FIG. 2F, shown therein is the resist layer 214 being exposed to a radiation 216 through a mask 218. In an embodiment, the radiation 216 is a DUV radiation such as KrF excimer laser (248 nm) or ArF excimer laser (193 nm). Alternatively, the radiation 216 may be an I-line (365 nm), a EUV radiation (e.g., 13.8 nm), an e-beam, an x-ray, an ion beam, or other suitable radiations. The radiation 216 causes the PAGs in the resist layer 214 to produce an acid. The exposure may be performed in air, in a liquid (immersion lithography), or in a vacuum (e.g., for EUV lithography and e-beam lithography). In the embodiment as shown, the radiation 216 is patterned with the mask 218, such as a transmissive mask or a reflective mask, which may include resolution enhancement techniques such as phase-shifting and/or optical proximity correction (OPC). In another embodiment, the radiation 216 is directly modulated with a predefined pattern, such as an IC layout, without using a mask (maskless lithography). Regardless of the radiation and the optional mask being used, the chromophore in the ARC layer 212 is tuned to absorb the radiation 216 that passes through the resist layer 214, thereby reducing reflections of the radiation off of the complicated topography on the substrate 202. This improves the resist pattern's uniformity.

Figure 2G:
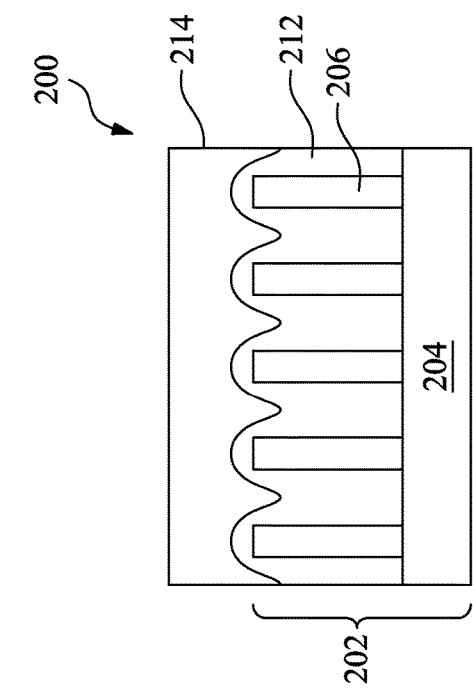

Referring to FIG. 2G, shown therein is the exposed resist layer 214 undergoing one or more post-exposure baking (PEB) processes. The PEB processes accelerate the cleaving of the ALGs in the resist layer 214. This cleaving reaction is catalytic, in the sense that the acid still remains after the reaction, and is therefore available to promote the cleaving of additional ALGs. Such a cleaving reaction will be terminated only when the acid produced comes in contact with a base, also referred to as a base quencher. When the ALGs leave the backbone polymer of the resist layer 214, the branch unit of the polymer will be changed to carboxylic group that increases the polymer's solubility to a positive tone developer and allows the irradiated area of the resist layer 214 to be removed by a developer. The non-irradiated area remains insoluble and becomes a masking element for subsequent processes.

Figure 2H:
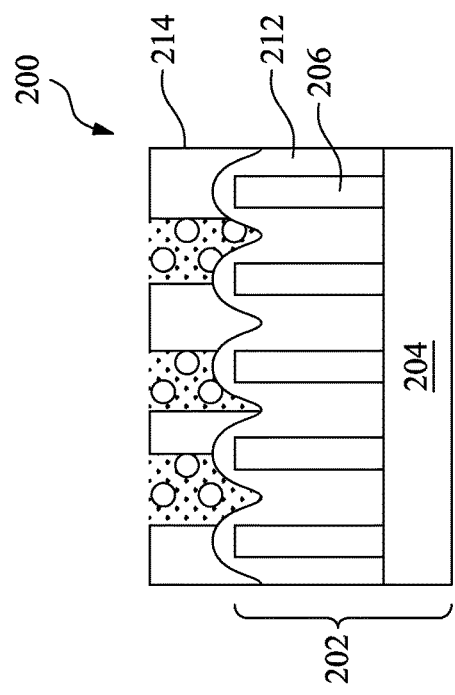

Referring to FIG. 2H, after undergoing a developing process in a developer, portions of the exposed resist layer 214 are removed, resulting in a patterned resist layer 214 (or resist pattern 214). The resist pattern 214 has various openings 220. In some embodiments, a developer includes a water based developer, such as tetramethylammonium hydroxide (TMAH) for a positive tone development (PTD). In other embodiments, a developer may include an organic solvent or a mixture of organic solvents, such as methyl a-amyl ketone (MAK) or a mixture involving the MAK, for a negative tone development (NTD). Applying a developer includes spraying the developer on the exposed resist layer 214, for example, by a spin-on process. The developing process may further include a post develop baking (PDB) process. In the present embodiment, the developing process does not substantially dissolve or remove the ARC layer 212. Rather, it exposes the ARC layer 212 through the openings 220. The resist pattern 214 has a critical dimension CD, labeled on one of the representative patterns in FIG. 2H.

Figure 2I:
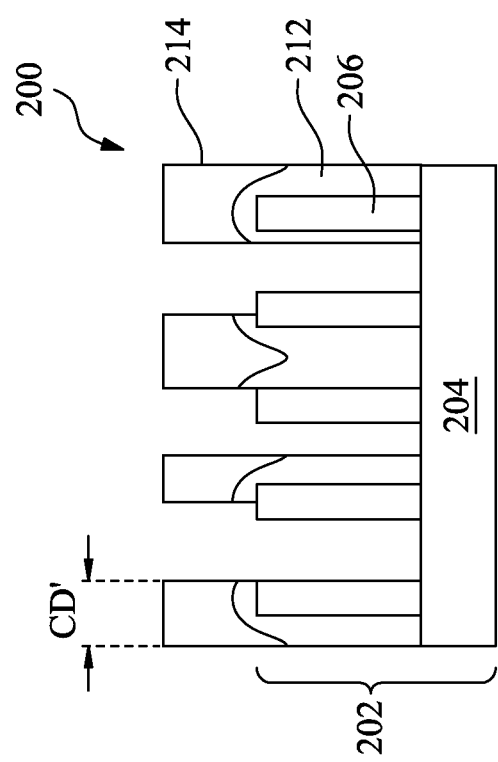

The method 100 (FIG. 1) proceeds to operation 114 by etching the ARC layer 212 through the openings 220. Referring to FIG. 2I, the resist pattern 214 acts as an etch mask to protect the rest of the ARC layer 212 from the etching process. In an embodiment, the etching process is a dry etching process. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. Because the ARC layer 212 has a low etching resistance, the resist pattern 214 is substantially preserved during the etching process and its critical dimension remains substantially unchanged, i.e., CD' of FIG. 2I is about the same as CD of FIG. 2H.

The method 100 (FIG. 1) proceeds to operation 116 by processing the substrate 202 with the resist pattern 214 and the patterned ARC layer 212. Many processes may be performed by operation 116. In an embodiment, operation 116 includes an ion implantation to the substrate 202. For example, an ion implantation may be used for forming lightly doped source/drain (LDD) or heavily doped source/drain (HDD) in the substrate 202. In an embodiment, operation 116 includes a fin-cut process. For example, the second layer 206 may include a plurality of spacer fins formed using a mandrel-spacer process and the operation 106 may cut the end of the spacer fins so that only parallel fin structures are kept. Further steps may be performed to complete the formation of the device 200.

Although not intended to be limiting, one or more embodiments of the present disclosure provide many benefits to a semiconductor device and the formation thereof. As discussed above, the quality of a resist pattern directly impacts the quality of a finally fabricated device. Among various measures, resist pattern fidelity is of particular concern. To preserve a resist pattern's fidelity during an ARC under-layer opening process, the present disclosure provides a novel ARC composition and methods of using the same. The novel ARC composition can be made with presently available ingredients and the methods of using the ARC composition can be easily integrated into existing process flows. An ARC layer formed with the ARC composition provides sufficient reflectivity control during resist exposure, while has low etching resistance during the ARC layer opening process. Therefore, it helps improve resist pattern uniformity and fidelity in the lithography patterning process.

In one exemplary aspect, the present disclosure is directed to a method for lithography patterning. The method includes receiving a substrate; applying an anti-reflective coating (ARC) composition over the substrate; crosslinking the ARC composition thereby forming an ARC layer; and reducing a film density of the ARC layer by cleaving an acid labile group (ALG) in the ARC layer. In an embodiment, the method further includes forming a resist layer over the ARC layer; patterning the resist layer, resulting in a patterned resist layer; and etching the ARC layer using the patterned resist layer as an etch mask.

In another exemplary aspect, the present disclosure is directed to a method for lithography patterning. The method includes receiving a substrate and applying an anti-reflective coating (ARC) composition over the substrate wherein the ARC composition comprises a polymer, an acid labile group (ALG), and a thermal acid generator. The method further includes forming an ARC layer by crosslinking the polymer; reducing a film density of the ARC layer by cleaving the ALG of the ARC layer; and forming a resist layer over the ARC layer. In an embodiment, the method further includes patterning the resist layer, resulting in a patterned resist layer; and applying a dry etching process to the ARC layer using the patterned resist layer as an etch mask, resulting in a patterned ARC layer underneath the patterned resist layer.

In another exemplary aspect, the present disclosure is directed to an anti-reflective coating (ARC) composition for use in lithography patterning. The ARC composition includes a polymer, about 35% to about 95% by weight, wherein the polymer includes a chromophore; an acid labile group (ALG), more than 5% by weight; and a thermal acid generator. In an embodiment, the thermal acid generator is more than 0.05% by weight. In an embodiment, the ARC composition further includes a crosslinker, less than about 60% by weight.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for lithography patterning, comprising:
   receiving a substrate;
   applying an anti-reflective coating (ARC) composition over the substrate;
   forming an ARC layer by radiating the ARC composition with an ultraviolet (UV) radiation to crosslink the ARC composition;
   reducing a film density of the ARC layer by cleaving an acid labile group (ALG) in the ARC layer; and
   after the reducing the film density of the ARC layer, forming a resist layer over the ARC layer.

2. The method of claim 1, wherein the cleaving of the ALG includes baking the ARC layer at a first temperature so as to thermally generate an acid in the ARC layer.

3. The method of claim 1, wherein the applying of the ARC composition includes a spin coating process.

4. The method of claim 1, further comprising:
   patterning the resist layer, resulting in a patterned resist layer; and
   etching the ARC layer using the patterned resist layer as an etch mask.

5. The method of claim 4, wherein the etching of the ARC layer is by dry etching.

6. The method of claim 4, wherein the patterning of the resist layer includes:
   exposing the resist layer; and
   developing the resist layer in a developer that does not substantially dissolve the ARC layer.

7. The method of claim 1, wherein the substrate includes silicon.

8. The method of claim 1, wherein prior to the reducing the film density of the ARC layer, the ARC layer has a first etching rate associated with an etching chemical, and wherein after the reducing the film density of the ARC layer, the ARC layer has a second etching rate associated with the etching chemical, wherein the second etching rate is higher than the first etching rate.

9. A method for lithography patterning, comprising:
   receiving a substrate;
   applying an anti-reflective coating (ARC) composition over the substrate wherein the ARC composition comprises a polymer, an acid labile group (ALG) connecting a chromophore to a polymer backbone of the polymer; and a thermal acid generator;
   forming an ARC layer by baking the ARC composition at a first temperature to crosslink the polymer;
   reducing a film density of the ARC layer by baking the ARC layer at a second temperature higher than the first temperature, wherein the reducing the film density of the ARC layer includes:
      removing the ALG and the chromophore connected to the ALG in the ARC layer; and
   forming a resist layer over the ARC layer.

10. The method of claim 9, wherein the ARC composition further comprises a crosslinker.

11. The method of claim 9, wherein the baking the ARC layer at the second temperature causes the thermal acid generator to generate a first acid.

12. The method of claim 11, wherein the crosslinking of the polymer is in the presence of a second acid that is different from the first acid.

13. The method of claim 12, wherein the baking the ARC composition at the first temperature causes a second thermal acid generator of the ARC composition to generate the second acid.

14. The method of claim 11, wherein the reducing the film density of the ARC layer includes:
   cleaving the ALG of the ARC layer using the first acid.

15. The method of claim 14, wherein after the reducing the film density, the ARC layer has a lower etching resistance.

16. The method of claim 9, further comprising:
   patterning the resist layer, resulting in a patterned resist layer; and
   applying a dry etching process to the ARC layer using the patterned resist layer as an etch mask, resulting in a patterned ARC layer underneath the patterned resist layer.

17. The method of claim 16, further comprising:
   processing the substrate using the patterned resist layer and the patterned ARC layer as a mask.

18. An anti-reflective coating (ARC) composition for use in lithography patterning, comprising:
   a polymer, about 35% to about 95% by weight, wherein the polymer includes a chromophore;
   an acid labile group (ALG), more than 5% by weight, wherein the ALG connects the chromophore to a polymer backbone of the polymer;
   a first thermal acid generator for generating a first acid for crosslinking the polymer at a first temperature; and
   a second thermal acid generator for generating a second acid for cleaving the ALG and removing the chromophore connected to the ALG at a second temperature higher than the first temperature, wherein the second acid is different from the first acid.

19. The ARC composition of claim 18, wherein the second thermal acid generator is more than 0.05% by weight.

20. The ARC composition of claim 18, further comprising:
   a crosslinker, less than about 60% by weight.

* * * * *